(12) United States Patent
Mishima

(10) Patent No.: US 7,084,557 B2
(45) Date of Patent: Aug. 1, 2006

(54) LIGHT-EMITTING DEVICE AND METHOD FOR PRODUCING SAME

(75) Inventor: Masayuki Mishima, Kanagawa-ken (JP)

(73) Assignee: Fuji Photo Film Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/000,323

(22) Filed: Dec. 4, 2001

(65) Prior Publication Data

US 2002/0125819 A1 Sep. 12, 2002

(30) Foreign Application Priority Data

Dec. 5, 2000 (JP) .............................. 2000-370151

(51) Int. Cl.
*H01L 51/40* (2006.01)

(52) U.S. Cl. ........................ 313/25; 445/24; 313/504; 313/512

(58) Field of Classification Search ........ 313/498–512; 445/24, 25
See application file for complete search history.

(56) References Cited

U.S. PATENT DOCUMENTS

| | | | | |
|---|---|---|---|---|
| 5,200,668 | A | * | 4/1993 | Ohashi et al. .............. 313/498 |
| 5,932,363 | A | * | 8/1999 | Hu et al. .................... 428/690 |
| 5,962,962 | A | * | 10/1999 | Fujita et al. ................ 313/412 |
| 6,049,167 | A | * | 4/2000 | Onitsuka et al. ............ 313/512 |
| 6,097,147 | A | | 8/2000 | Baldo et al. ................. 313/506 |
| 6,210,815 | B1 | * | 4/2001 | Ooishi ........................ 428/690 |
| 6,268,071 | B1 | * | 7/2001 | Yasukawa et al. .......... 428/690 |
| 6,303,238 | B1 | * | 10/2001 | Thompson et al. ......... 428/690 |
| 6,413,656 | B1 | * | 7/2002 | Thompson et al. ......... 428/690 |
| 6,566,805 | B1 | * | 5/2003 | Tsai et al. ................... 313/504 |
| 6,612,888 | B1 | * | 9/2003 | Pai et al. ....................... 445/24 |
| 6,617,052 | B1 | * | 9/2003 | Morii .......................... 428/690 |
| 2002/0034659 | A1 | * | 3/2002 | Nishi et al. ................. 428/690 |
| 2002/0068192 | A1 | * | 6/2002 | Moriyama et al. .......... 428/690 |
| 2003/0072964 | A1 | * | 4/2003 | Kwong et al. .............. 428/690 |

OTHER PUBLICATIONS

Baldo et al, "Very high-efficiency green organic light-emitting devices based on electrophosphoresence", Applied Physics Letters vol. 75, No. 1, pp. 4-6, Jul. 1999.

Tsutsui et al, "High Quantum Efficiency in Organic Light-Emitting Devices with Iridium-Complex as a Triplet Emissive Center", Jpn. J. Applied Physics vol. 38, (Dec. 15, 1999), Pt. 2, No. 12B, pp. L1502-1504.

O'Brien et al, "Electrophosphoresence from a doped polymer light emitting diode", Synthetic Metals 116 (2001) 379-383.

Lee et al, "Polymer phosphorescent light-emitting devices doped with tris(2-phenylpyridine) iridium as a triplet emitter", Applied Physics Letter vol. 77, No. 15, pp. 2280-2286, Oct. 9, 2000.

* cited by examiner

*Primary Examiner*—Karabi Guharay
(74) *Attorney, Agent, or Firm*—Sughrue Mion, PLLC

(57) ABSTRACT

A light-emitting device obtained by a method comprising the steps of disposing a transparent electrode, one or more organic layers and a back side electrode on a substrate to provide a light-emitting structure, and disposing sealing parts on the light-emitting structure to isolate the one or more organic layers from external air, wherein the one or more organic layers comprises a light-emitting layer containing a phosphorescent compound, and the light-emitting layer, the back side electrode and the sealing parts are disposed in an atmosphere where both of a moisture concentration and an oxygen concentration are 100 ppm or less.

37 Claims, No Drawings

LIGHT-EMITTING DEVICE AND METHOD FOR PRODUCING SAME

FIELD OF THE INVENTION

The present invention relates to a light-emitting device excellent in luminance, light-emitting efficiency and durability, and a method for producing the light-emitting device.

BACKGROUND OF THE INVENTION

Organic light-emitting devices comprising an organic compound have been considered to be useful for an economical, solid emission type light-emitting device having a large emission area such as a full color display device and a writing light source array, thereby having been actively studied in recent years. The organic light-emitting device generally comprises a couple of electrodes and one or more organic layers containing a light-emitting layer disposed between the electrodes. When to the organic light-emitting device is applied a voltage, electrons are injected from a negative electrode and holes are injected from a positive electrode to the organic layers. The electrons and the holes are recombined in the light-emitting layer and energy is converted into light while an energy level is turned from a conduction band to a valence band, whereby the organic light-emitting device emits light.

The conventional organic light-emitting devices require high applying voltage for light emission and are poor in luminance and light-emitting efficiency. Some proposals have been provided to overcome the problem in recent years, for example, an organic light-emitting device comprising organic thin layers of a vapor-deposited organic compound has been disclosed in Applied Physics Letters, 51, 913 (1987). This organic light-emitting device has a bilayer lamination structure where an electron-transporting layer and a hole-transporting layer are laminated between the electrodes, thereby exhibiting more excellent light-emitting properties than that of devices having a single-layer structure. This organic light-emitting device uses a low molecular weight amine compound as a hole-transporting material and 8-quinolinol aluminum complex (Alq) as an electron-transporting, light-emitting material to emit a green light. After this disclosure, various organic light-emitting devices comprising the vapor-deposited organic thin layers have been developed as disclosed in Macromolecularly Symposium, 125, 1 (1997) and references therein, etc. However, such organic light-emitting devices are inferior in the light-emitting efficiency to inorganic LED devices and fluorescent tubes, thereby being far from practicable.

Most of the conventional organic light-emitting devices are such that utilizes singlet excitons generated in the organic light-emitting material to provide fluorescence. According to simple mechanism in quantum chemistry, ratio of the singlet excitons providing fluorescence to triplet excitons providing phosphorescence is 1/3 in an excitation state. Therefore, the organic light-emitting device providing fluorescence can practically utilize only 25% of the excitons, thereby inevitably being poor in the light-emitting efficiency.

Under such circumstances, phosphorescent light-emitting devices using a phenylpyridine-iridium complex have been disclosed in Appl. Phys. Lett., Vol. 75, Page 4 (1999), Jpn. J. Appl. Phys., Vol. 38, Page L1502 (1999), etc. in recent years. The light-emitting efficiency of the phosphorescent light-emitting device is two to three times higher than those of the conventional fluorescent light-emitting devices. However, the light-emitting efficiency of the phosphorescent light-emitting device is lower than theoretical light-emitting efficiency, and thus, the light-emitting efficiency has been desired to be further improved to put the phosphorescent light-emitting device into practical use. Further, the phosphorescent light-emitting device has been required to be further improved with respect to the durability because it is inferior therein to the conventional fluorescent light-emitting devices.

Although the organic layer of the organic light-emitting device may be formed by a vapor deposition method, a sputtering method, a CVD method, a PVD method, an applying method using a solvent, etc., the organic layer is desirably formed by a wet film-forming method (a coating method) such as the applying method from the viewpoints of simplification of production processes, reduction of production costs, improvement of workability, application to a flexible device having a large emitting area such as a back light and an illuminated light source, etc. In the known phosphorescent light-emitting devices mentioned above, the organic layer composed of the low molecular weight compound is formed by a dry film-forming method such as a vapor deposition method. Thus, the devices are inevitably deteriorated by crystallization of the low molecular weight compound to require high production costs and to be poor in producibility.

Organic light-emitting devices comprising an organic layer of a high molecular weight compound formed by a wet film-forming method have been disclosed and poly(p-phenylenevinylene) that emits a green light (Nature, Vol. 347, Page 539, (1990)), poly(3-alkylthiophene) that emits an orange-red light (Jpn. J. Appl. Phys., Vol. 30, Page L1938 (1991)), polyalkylfluorene that emits a blue light (Jpn. J. Appl. Phys., Vol. 30, Page L1941 (1991)), etc. have been known as the high molecular weight compound. Further, Japanese Patent Laid-Open No. 2-223188 has disclosed a method where a low molecular weight compound is dispersed in a binder resin and formed into a layer by a wet applying method. However, the organic light-emitting device comprising the organic layer formed by the wet method is such that utilizes the singlet excitons, thereby being still disadvantageous in a low light-emitting efficiency.

OBJECT AND SUMMARY OF THE INVENTION

An object of the present invention is to provide a light-emitting device excellent in luminance, light-emitting efficiency and durability, which can be produced with low production costs and can be easily increased in emitting area to be useful for a full color display, a back light, a surface light source such as an illuminated light source, a light source array of a printer, etc.

Another object of the present invention is to provide a method for producing the light-emitting device.

As a result of intense research in view of the above objects, the inventor has found that a phosphorescent light-emitting device utilizing triplet excitons is liable to be affected and quenched by moisture and oxygen differently from a fluorescent light-emitting device utilizing singlet excitons, and therefore, a phosphorescent light-emitting device excellent in light-emitting properties and durability can be obtained by providing a light-emitting layer, a back side electrode and sealing parts in an atmosphere where both of a moisture concentration and an oxygen concentration are low level. The present W invention has been accomplished by the finding.

Thus, a light-emitting device of the present invention is obtained by a method comprising the steps of disposing a transparent electrode, one or more organic layers and a back side electrode on a substrate to provide a light-emitting structure, and disposing sealing parts on the light-emitting structure to isolate the one or more organic layers from external air, wherein the one or more organic layers comprises a light-emitting layer containing a phosphorescent compound, and the light-emitting layer, the back side electrode and the sealing parts are disposed in an atmosphere where both of a moisture concentration and an oxygen concentration are 100 ppm or less. The light-emitting device of the present invention is excellent in luminance, light-emitting efficiency and durability, and useful for a full color display, a back light, a surface light source such as an illuminated light source, a light source array of a printer, etc.

A method of the present invention for producing a light-emitting device comprises the steps of disposing a transparent electrode, one or more organic layers and a back side electrode on a substrate to provide a light-emitting structure, and disposing sealing parts on the light-emitting structure to isolate the one or more organic layers from external air, wherein the one or more organic layers comprises a light-emitting layer containing a phosphorescent compound, and the light-emitting layer, the back side electrode and the sealing parts are disposed in an atmosphere where both of a moisture concentration and an oxygen concentration are 100 ppm or less.

In the present invention, the one or more organic layers is preferably isolated from external air after disposing the light-emitting layer until the sealing parts are disposed. The moisture concentration and the oxygen concentration are both preferably 50 ppm or less, more preferably 30 ppm or less. Further, to produce the light-emitting device with reduced production costs or to increase an emitting area of the device, at least one of the organic layers is preferably formed by a wet film-forming method.

The one or more organic layers preferably comprises a hole-injecting layer in contact with the light-emitting layer, the hole-injecting layer being over the transparent electrode. It is particularly preferable that both of the hole-injecting layer and the light-emitting layer are formed by a wet film-forming method. Further, the light-emitting device preferably comprises an electron-transporting layer between the light-emitting layer and the back side electrode. A weight ratio of the phosphorescent compound is preferably 0.1 to 70 weight % based on the total weight of the light-emitting layer. The phosphorescent compound is preferably an ortho-metallation complex. Further, an ultraviolet-hardening resin is preferably used in combination with the sealing parts to seal the organic layers.

DETAILED DESCRIPTION OF THE PREFERRED EMBODIMENTS

A light-emitting device of the present invention can be obtained by a method of the present invention, which comprises the steps of disposing a transparent electrode, one or more organic layers and a back side electrode on a substrate to provide a light-emitting structure, and disposing sealing parts on the light-emitting structure to isolate the one or more organic layers from external air. The one or more organic layers comprises a light-emitting layer containing a phosphorescent compound. The one or more organic layers may comprise such a layer as a protective layer, etc. in addition to the light-emitting layer if necessary. Incidentally, the term "light-emitting structure" used in this invention means an assembly comprising the substrate, the transparent electrode, the one or more organic layers and the back side electrode.

In the present invention, processes of disposing the light-emitting layer, the back side electrode and the sealing parts are carried out in an atmosphere where both of a moisture concentration and an oxygen concentration are 100 ppm or less, whereby amount of remaining water and oxygen in the resulting device is reduced. As a result, disappearance of triplet excitons generated in the light-emitting device is suppressed and the device exhibits excellent luminance, light-emitting efficiency and durability. It is also preferred that the organic layer other than the light-emitting layer such as a protective layer, etc. is disposed in the above-mentioned atmosphere. In particular, it is preferred that the one or more organic layers is not exposed to the air from the process of disposing the light-emitting layer to the process of disposing the sealing parts. The moisture concentration of the above atmosphere is 100 ppm or less, preferably 50 ppm or less, more preferably 30 ppm or less. The oxygen concentration of the above atmosphere is 100 ppm or less, preferably 50 ppm or less, more preferably 30 ppm or less.

In the light-emitting device of the present invention, the light-emitting structure may have such a laminate on the substrate as: transparent electrode/light-emitting layer/back side electrode; transparent electrode/hole-injecting layer/light-emitting layer/back side electrode; transparent electrode/light-emitting layer/electron-transporting layer/back side electrode; transparent electrode/hole-transporting layer/light-emitting layer/electron-transporting layer/back side electrode; transparent electrode/hole-transporting layer/light-emitting layer/back side electrode; transparent electrode/light-emitting layer/electron-transporting layer/electron-injecting layer/back side electrode; transparent electrode/hole-injecting layer/light-emitting layer/electron-transporting layer/back side electrode; transparent electrode/hole-injecting layer/hole-transporting layer/light-emitting layer/electron-transporting layer/electron-injecting layer/back side electrode; the reversed laminate thereof; etc. The light-emitting layer comprises the phosphorescent compound and the light-emitting device generally allows light emission from the transparent electrode side. It is particularly preferable that the light-emitting structure comprises the hole-injecting layer between the light-emitting layer and the transparent electrode, both of the hole-injecting layer and the light-emitting layer being formed by a wet film-forming method. Further, the light-emitting device preferably comprises the electron-transporting layer between the light-emitting layer and the back side electrode. Examples of materials for each layer are described in "Organic EL Display" (Technotimes Co., Separate Volume of "Monthly Display", the October issue of 1998), etc.

Although the position of the organic layers in the light-emitting device is not particularly limited and may be appropriately selected in accordance with applications and purposes of the light-emitting device, the organic layers are preferably disposed on the transparent electrode or on the back side electrode. The organic layers may be disposed on the whole surface or a part of the transparent electrode or the back side electrode. Shape, size and thickness of the organic layers may be also appropriately selected in accordance with applications and purposes.

The organic layers may be formed by a dry film-forming method or a wet film-forming method. To produce the light-emitting device excellent in the luminance and the light-emitting efficiency with reduced production costs and to increase an emitting area of the organic layers, at least one of the organic layers is preferably formed by the wet film-forming method (the coating method). Vapor deposition methods, spattering methods, etc. may be used as the dry film-forming method, and dipping methods, spin coating methods, dip coating methods, casting methods, die coating methods, roll coating methods, bar coating methods, gravure coating methods, etc. may be used as the wet film-forming method. These methods may be properly selected depending on the materials used for the organic layers. In the case of using the wet film-forming method, the resulting layer may be dried after the film-forming. Conditions such as temperature, pressure, etc. for drying may be selected such that the formed layer is not destroyed.

Application liquid used in the wet film-forming method is generally composed of a solvent and a material for the organic layer dissolved or dispersed in the solvent. The solvent is not particularly limited and may be appropriately selected depending on the material for the organic layer. Examples of the solvent include: halogen-containing solvents such as chloroform, carbon tetrachloride, dichloromethane, 1,2-dichloroethane and chlorobenzene; ketone solvents such as acetone, methyl ethyl ketone, diethyl ketone, n-propyl methyl ketone and cyclohexanone; aromatic solvents such as benzene, toluene and xylene; ester solvents such as ethyl acetate, n-propyl acetate, n-butyl acetate, methyl propionate, ethyl propionate, y-butyrolactone and diethyl carbonate; ether solvents such as tetrahydrofuran and dioxane; amide solvents such as dimethylformamide and dimethylacetamide; dimethylsulfoxide; water; etc. Solid content of the application liquid is not particularly limited and viscosity of the application liquid may be appropriately controlled in accordance with the film-forming method.

The light-emitting device may be produced by means of, for example, an equipment composed of an apparatus for forming the light-emitting layer and the back side electrode by spin-coating, vapor deposition, spattering, etc. and a glove box connected to the apparatus. The inner atmosphere of the glove box is generally replaced with an inert gas having the moisture concentration of 100 ppm or less and the oxygen concentration of 100 ppm or less while the light-emitting layer, the back side electrode and the sealing parts are disposed. The inert gas may be a nitrogen gas, an argon gas, etc.

In the case where the light-emitting layer is formed by the wet film-forming method, the light-emitting device may be produced as follows: the transparent electrode is disposed on the substrate; the resultant is put into the glove box filled with the inert gas and dried by heating, etc.; the application liquid is applied to the transparent electrode by a spin-coater, etc. in the glove box and dried to provide the light-emitting layer; this is then put into a vapor deposition apparatus connected with the glove box and the back side electrode is formed therein to prepare the light-emitting structure; and thus-obtained light-emitting structure is put into the glove box again and the light-emitting layer is sealed with the sealing parts.

The light-emitting device of the present invention generally emits light when direct voltage of approximately 2 to 40 V or direct current is applied to the transparent electrode and the back side electrode. The direct voltage may contain alternating voltage. Further, the light-emitting device may be driven by a method described in Japanese Patent Laid-Open Nos. 2-148687, 6-301355, 5-29080, 7-134558, 8-234685 and 8-241047, U.S. Pat. Nos. 5,828,429 and 6,023,308, Japanese Patent No. 2784615, etc. Each component of the light-emitting device according to the present invention will be described in detail below without intention of restricting the scope of the present invention.

(A) Substrate

Examples of material used for the substrate include: inorganic materials such as yttrium-stabilized zirconia (YSZ) and glasses; polymer materials such as polyesters (polyethylene terephthalate, polybutylene terephthalate, polyethylene naphthalate, etc.), polystyrene, polycarbonates, polyethersulfones, polyarylates, allyldiglycolcarbonate, polyimides, polycyclolefins, norbomene resins, poly(chlorotrifluoroethylene), teflon and polytetrafluoroethylene-polyethylene copolymer; etc. The substrate may be made of one material or a plurality of materials. Among the materials, preferred are the polymer materials to produce a flexible light-emitting device and more preferred are such that is excellent in heat resistance, dimensional stability, solvent resistance, insulation property and workability and poor in gas permeability and hygroscopicity, for example, polyesters, polycarbonates, polyethersulfones, fluorine-containing polymer materials such as poly(chlorotrifluoroethylene), teflon and polytetrafluoroethylene-polyethylene copolymer.

Shape, structure and size of the substrate may be appropriately selected in accordance with purposes and applications of the light-emitting device. The substrate is generally in a plate-shape. The substrate may have a single-layer structure or a multi-layer structure. The substrate may be composed of one member or a plurality of members. The substrate may be colorless or colored, however, it is preferable that the substrate is colorless and transparent such that light emitted from the light-emitting layer is not scattered or damped.

On one surface or the both surfaces of the substrate may be disposed a moisture permeation-inhibiting layer and/or a gas barrier layer. Such layers are preferably made of an inorganic compound such as silicon nitride, silicon oxide, etc. The moisture permeation-inhibiting layer and the gas barrier layer may be provided by a radio frequency sputtering method, etc. Further, a hard coating layer and an undercoating layer may be disposed on the substrate, if necessary.

(B) Transparent Electrode

The transparent electrode generally acts to supply positive holes to the organic layer as a positive electrode. The transparent electrode may act as a negative electrode, and in this case, the back side electrode acts as the positive electrode. The explanations will be made with respect to the case of using the transparent electrode as the positive electrode.

Shape, structure and size of the transparent electrode is not particularly limited and may be appropriately selected in accordance with applications and purposes of the light-emitting device. The transparent electrode may be made of a metal, an alloy, a metal oxide, an electrically conductive compound, a mixture thereof, etc. The transparent electrode is preferably made of a material having a work function of 4 eV or more. Examples of the material for the transparent electrode include: antimony-doped tin oxide (ATO); fluorine-doped tin oxide (FTO); semiconductive metal oxides such as tin oxide, zinc oxide, indium oxide, indium tin oxide (ITO) and indium zinc oxide (IZO); metals such as gold, silver, chromium and nickel; mixtures and laminations of the metal and a conductive metal oxide; inorganic conductive compounds such as copper iodide and copper sulfide; organic conductive compounds such as polyaniline, polythiophene and polypyrrole; laminations of the organic conductive compound and ITO; etc.

Method for forming the transparent electrode is not particularly limited and may be appropriately selected depending on the material used therefor from: wet methods such as printing methods and coating methods; physical methods such as vacuum deposition methods, sputtering methods and ion-plating methods; chemical methods such as CVD methods and plasma CVD methods; etc. For example, the transparent electrode of ITO is preferably disposed by a direct sputtering method, an RF sputtering method, a vapor deposition method, an ion-plating method, etc. The transparent electrode of the organic conductive compound is preferably disposed by the wet method.

Patterning the transparent electrode may be achieved by a chemical etching method such as a photolithography or a physical etching method using laser, etc. In addition, the transparent electrode may be patterned by vacuum vapor deposition or sputtering while masking, a lift-off method, a printing method, etc.

Although the position of the transparent electrode in the light-emitting device is not particularly limited and may be appropriately selected in accordance with applications and purposes of the light-emitting device, the transparent electrode is preferably disposed on the substrate. The transparent electrode may be disposed on the whole surface or a part of the substrate.

Thickness of the transparent electrode may be properly controlled depending on the material used therefor. The thickness is generally 10 nm to 50 μm, preferably 50 nm to 20 μm. The resistance of the transparent electrode is preferably $10^3$ Ω/square or less, more preferably $10^2$ Ω/square or less. The transparent electrode may be colorless or colored. Light transmittance of the transparent electrode is preferably 60% or more, more preferably 70% or more to allow light emission from the transparent electrode side. The light transmittance can be measured by a known method using a spectrophotometer.

Further, electrodes disclosed in "Tomei-Dodenmaku no Shintenkai (Development of the Transparent Electrically Conductive Film)" supervised by Yutaka Sawada, CMC, Ink., 1999, etc. may be used as the transparent electrode. Particularly in the case of using a plastic substrate poor in heat resistance, it is preferable that the transparent electrode is made of ITO or IZO and formed at a low temperature of 150° C. or less.

(C) Back Side Electrode

The back side electrode generally acts to supply electrons to the organic layers as the negative electrode. The back side electrode may act as the positive electrode, and in this case, the above transparent electrode acts as the negative electrode. The explanations will be made with respect to the case of using the back side electrode as the negative electrode.

Shape, structure and size of the back side electrode is not particularly limited and may be appropriately selected in accordance with applications and purposes of the light-emitting device. The back side electrode may be made of a metal, an alloy, a metal oxide, an electrically conductive compound, a mixture thereof, etc. The back side electrode is preferably made of a material having a work function of 4.5 eV or less. Examples of the material used for the back side electrode include: alkali metals such as Li, Na, K and Cs; alkaline earth metals such as Mg and Ca; gold; silver; lead; aluminum; a sodium-potassium alloy; a lithium-aluminum alloy; a magnesium-silver alloy; indium; rare earth metals such as ytterbium; etc. Although the materials may be used singly, it is preferable that the back side electrode is made of a plurality of materials to improve both of stability and electron injection property. Among the materials, alkali metals and alkaline earth metals are preferred from the viewpoint of the electron injection property and aluminum-based materials are preferred from the viewpoint of the stability during storage. Used as the aluminum-based material are simple substance of aluminum, and alloys and mixtures comprising aluminum and 0.01 to 10 weight % of alkali metal or alkaline earth metal such as a lithium-aluminum alloy, a magnesium-aluminum alloy, etc. The back side electrode may be made of a material disclosed in Japanese Patent Laid-Open Nos. 2-15595 and 5-121172, etc.

Method for forming the back side electrode is not particularly limited, and may be appropriately selected depending on the material used therefor from: wet methods such as printing methods and coating methods; physical methods such as vacuum deposition methods, sputtering methods and ion-plating methods; chemical methods such as a CVD method and a plasma CVD method; etc. In the case of using a plurality of materials for the back side electrode, the materials may be spattered simultaneously or in order.

Patterning the back side electrode may be achieved by a chemical etching method such as a photolithography or a physical etching method using laser, etc. In addition, the back side electrode may be patterned by vacuum vapor deposition or sputtering while masking, a lift-off method, a printing method, etc.

Although the position of the back side electrode in the light-emitting device is not limited and may be appropriately selected in accordance with applications and purposes of the light-emitting device, the back side electrode is preferably disposed on the organic layer. The back side electrode may be disposed on the whole surface or a part of the organic layer. Further, a dielectric layer may be disposed between the back side electrode and the organic layer. The dielectric layer may be made of a fluorinated alkali metal or an alkaline earth metal and may have a thickness of 0.1 to 5 nm. The dielectric layer may be formed by a vacuum vapor deposition method, a spattering method, an ion-plating method, etc.

Thickness of the back side electrode may be properly controlled depending on the material used therefor. The thickness is generally 10 nm to 5 μm, preferably 50 nm to 1 μm. The back side electrode may be transparent or opaque. The transparent back side electrode may be a laminate composed of a thin layer of the above-mentioned material having a thickness of 1 to 10 nm and a transparent conductive layer of ITO, IZO, etc.

(D) Light-Emitting Layer

The light-emitting layer comprises the phosphorescent compound. The phosphorescent compound used in this invention is not particularly limited only if it can utilize triplet excitons for light emission. The phosphorescent compound is preferably an ortho-metallation complex or a porphyrin complex, more preferably an ortho-metallation complex. The porphyrin complex is preferably a porphyrin-platinum complex. The phosphorescent compound may be used singly and a plurality of the phosphorescent compounds may be used in combination with each other.

The ortho-metallation complex used in the present invention may be such a compound that is described in: Akio Yamamoto, "Yukikinzoku-Kagaku, Kiso to Oyo (Metalorganic Chemistry, Foundation and Application)", Page 150 to 232, Shokabo Publishing Co., Ltd., (1982); H. Yersin, "Photochemistry and Photophysics of Coordination Compounds", Page 71 to 77 and 135 to 146, Springer-Verlag, Inc. (1987), etc. Although ligands of the ortho-metallation complex is not particularly limited, the ortho-metallation complex generally has a particular ligand. Preferred examples of the particular ligand include 2-phenylpyridine derivatives, 7,8-benzoquinoline derivatives, 2-(2-thienyl)pyridine derivatives, 2-(1-naphthyl)pyridine derivatives and 2-phenylquinoline derivatives. The derivatives may have a substituent. The ortho-metallation complex may have a ligand other than the particular ligand. A central metal atom of the ortho-metallation complex may be selected from transition metals. The central metal is preferably rhodium, platinum, gold, iridium, ruthenium or palladium, particularly preferably iridium. The organic layer comprising such an ortho-metallation complex is excellent in the luminance and the light-emitting efficiency. Complexes disclosed in Japanese Patent No. 2000-254171, Paragraphs 0152 to 0180 may be used as the ortho-metallation complex in the present invention.

The ortho-metallation complex used in the present invention may be synthesized by a known method disclosed in: Inorg. Chem., 30, 1685, 1991; Inorg. Chem., 27, 3464, 1988; Inorg. Chem., 33, 545, 1994; Inorg. Chim. Acta, 181, 245, 1991; J. Organomet. Chem., 335, 293, 1987; J. Am. Chem. Soc., 107, 1431, 1985; etc.

A weight ratio of the phosphorescent compound in the light-emitting layer is not particularly limited. The weight ratio is preferably 0.1 to 70 weight %, more preferably 1 to 20 weight % based on the total weight of the light-emitting layer. If the weight ratio is less than 0.1 weight % or more than 70 weight %, there is a case where the phosphorescent compound cannot achieve sufficient effect.

The light-emitting layer may comprise a host compound, a hole-transporting material, an electron-transporting material, an electrically inactive polymer binder, etc. if necessary.

The host compound acts to accelerate light emission of the phosphorescent compound such that the host compound is excited and energy is transferred from the excited host compound to the phosphorescent compound. Examples of the host compound include: carbazole derivatives; triazole derivatives; oxazole derivatives; oxadiazole derivatives; imidazole derivatives; polyarylalkane derivatives; pyrazoline derivatives; pyrazolone derivatives; phenylenediamine derivatives; arylamine derivatives; amino-substituted chalcone derivatives; styrylanthracene derivatives; fluorenone derivatives; hydrazone derivatives; stilbene derivatives; silazane derivatives; aromatic tertiary amine compounds; styrylamine compounds; aromatic dimethylidyne compounds; porphyrin compounds; anthraquinodimethane derivatives; anthrone derivatives; diphenylquinone derivatives; thiopyran dioxide derivatives; carbodimide derivatives; fluorenylidenemethane derivatives; distyrylpyrazine derivatives; anhydrides derived from a heterocyclic tetracarboxylic acid having a structure such as naphthaleneperylene; phthalocyanine derivatives; 8-quinolinol metal complexes and derivatives thereof; metallophthalocyanines; metal complexes containing a benzoxazole ligand or a benzothiazole ligand; polysilane compounds; poly(N-vinylcarbazole) derivatives; aniline copolymers; electrically conductive polymers and oligomers such as oligothiophenes and polythiophenes; polythiophene derivatives; polyphenylene derivatives; polyphenylenevinylene derivatives; polyfluorene derivatives; etc. The host compound may be used singly or in combination with other host compound.

The hole-transporting material are not particularly limited and may be a low molecular weight material or a high molecular weight material if it has any function of: injecting the holes provided from the positive electrode into the light-emitting layer; transporting the holes; and blocking the electrons provided from the negative electrode. Examples of the hole-transporting material include carbazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidyne compounds, porphyrin compounds, polysilane compounds, poly(N-vinylcarbazole) derivatives, aniline copolymers, electrically conductive polymers and oligomers such as oligothiophenes and polythiophenes, polythiophene derivatives; polyphenylene derivatives; polyphenylenevinylene derivatives; polyfluorene derivatives; etc. The hole-transporting material may be used singly or in combination with other hole-transporting material.

The electron-transporting material are not particularly limited if only it has any function of: injecting the electrons provided from the negative electrode into the light-emitting layer; transporting the electrons; and blocking the holes provided from the positive electrode. Examples of the electron-transporting material include: triazole derivatives; oxazole derivatives; oxadiazole derivatives; fluorenone derivatives; anthraquinodimethane derivatives; anthrone derivatives; diphenylquinone derivatives; thiopyran dioxide derivatives; carbodimide derivatives; fluorenylidenemethane derivatives; distyrylpyrazine derivatives; anhydrides derived from a heterocyclic tetracarboxylic acid having a structure such as naphthaleneperylene; phthalocyanine derivatives; 8-quinolinol metal complexes and derivatives thereof; metallophthalocyanines; metal complexes containing a benzoxazole ligand or a benzothiazole ligand; aniline copolymers; electrically conductive polymers and oligomers such as oligothiophenes and polythiophenes; polythiophene derivatives; polyphenylene derivatives; polyphenylenevinylene derivatives; polyfluorene derivatives; etc.

Examples of the electrically inactive polymer binder include: polyvinyl chloride; polycarbonates; polystyrene; poly(methyl methacrylate); poly(butyl methacrylate); polyesters; polysulfones; polyphenylene oxide; polybutadiene; hydrocarbon resins; ketone resins; phenoxy resins; polyamides; ethylcellulose; poly(vinyl acetate); ABS resins; polyurethanes; melamine resins; unsaturated polyesters; alkyd resins; epoxy resins; silicone resins; polyvinylbutyral; polyvinylacetal; etc. The light-emitting layer containing the polymer binder can be easily formed by the wet film-forming method with a large area.

Thickness of the light-emitting layer is preferably 10 to 200 nm, more preferably 20 to 80 nm. The light-emitting layer having the thickness of more than 200 nm often requires increased driving voltage. On the other hand, when the thickness is less than 10 nm, there is a case where the light-emitting device short-circuits.

(E) Electron-Transporting Layer

The light-emitting device may comprise the electron-transporting layer if necessary. The electron-transporting layer may be composed of the above-mentioned electron-transporting material. The electron-transporting layer may further contain the polymer binder mentioned above. Thickness of the electron-transporting layer is preferably 10 to 200 nm, more preferably 20 to 80 nm. The thickness of more than 200 mn often increases the driving voltage for the light-emitting device, and the thickness of less than 10 nm often results in short-circuit of the light-emitting device.

(F) Hole-Transporting Layer

The light-emitting device may comprise the hole-transporting layer if necessary. The hole-transporting layer may be composed of the above-mentioned hole-transporting material. The hole-transporting layer may further contain the polymer binder mentioned above. Thickness of the hole-transporting layer is preferably 10 to 200 nm, more preferably 20 to 80 nm. The thickness of more than 200 nm often increases the driving voltage for the light-emitting device, and the thickness of less than 10 nm often results in short-circuit of the light-emitting device.

(G) Others

The light-emitting device of the present invention may comprise the protective layer disclosed in Japanese Patent Laid-Open Nos. 7-85974, 7-192866, 8-22891, 10-275682 and 10-106746, etc. The protective layer is generally disposed on the uppermost surface of the light-emitting device. In the light-emitting device where the substrate, the transparent electrode, the organic layers and the back side electrode are disposed in this order, the uppermost surface is the outer surface of the back side electrode. Further, in the light-emitting device where the substrate, the back side electrode, the organic layers and the transparent electrode are disposed in this order, the uppermost surface is the outer surface of the transparent electrode. Shape, size and thickness of the protective layer are not particularly limited. The protective layer may be made of any material that can prevent a substance such as water and oxygen, which can degrade the function of the light-emitting device, from entering or penetrating into the device. Silicon oxide, silicon dioxide, germanium oxide, germanium dioxide, etc. may be used for the protective layer.

A method for forming the protective layer is not particularly limited and the protective layer may be formed by a vacuum deposition method, a sputtering method, an activated sputtering method, a molecular beam epitaxy method (MBE method), a cluster ion beam method, an ion-plating method, a plasma polymerization method, a plasma CVD method, a laser CVD method, a thermal CVD method, a coating method, etc.

It is preferred that a sealing layer is disposed in the light-emitting device to prevent invasion or permeation of water or oxygen into the device. Examples of a material for the sealing layer include: copolymers of tetrafluoroethylene and at least one comonomer; fluorine-containing copolymers having a cyclic structure in the main chain; polyethylene; polypropylene; poly(methyl methacrylate); polyimides; polyureas; polytetrafluoroethylene; polychlorotrifluoroethylene; polydichlorodifluoroethylene; copolymers of chlorotrifluoroethylene or dichlorodifluoroethylene and another copolymer; a moisture-absorbing substance having a water absorption of 1% or more; a moisture-resistant substance having a water absorption of 0.1% or less; metals such as In, Sn, Pb, Au, Cu, Ag, Al, Ti and Ni; metal oxides such as MgO, SiO, $SiO_2$, $Al_2O_3$, GeO, NiO, CaO, BaO, $Fe_2O_3$, $Y_2O_3$ and $TiO_2$; metal fluorides such as $MgF_2$, LiF, $AlF_3$ and $CaF_2$; liquid fluorinated carbons such as perfluoroalkanes, perfluoroamines and perfluoroethers; dispersions prepared by adding an adsorbent for adsorbing moisture or oxygen to the liquid fluorinated carbon; etc.

In the light-emitting device of the present invention, the one or more organic layers is sealed by sealing parts such as a sealing plate and a sealing vessel to shield the device from invasion or penetration of moisture, oxygen, etc. The sealing parts may be disposed only on the back side electrode side. Alternatively, the entire light-emitting structure may be covered with the sealing parts. Shape, size and thickness of the sealing parts are not particularly limited if only the sealing parts can seal and shield the organic layers from the external air. The sealing parts may be made of: a glass; a stainless steel; a metal such as aluminum; a plastic such as poly(chlorotrifluoroethylene), polyester and polycarbonate; a ceramic; etc.

A sealing agent or an adhesive may be used when the sealing parts are disposed on the light-emitting structure. In the case of covering the entire light-emitting structure with the sealing parts, portions of the sealing parts may be heat-welded with each other without the sealing agent. Used as the sealing agent may be an ultraviolet-hardening resin, a thermosetting resin, a two-part type hardening resin, etc. Among them, the ultraviolet-hardening resin is preferable.

Further, a water-absorbing agent or an inert liquid may be interposed between the light-emitting structure and the sealing parts. The water-absorbing agent is not particularly limited and may be barium oxide, sodium oxide, potassium oxide, calcium oxide, sodium sulfate, calcium sulfate, magnesium sulfate, phosphorus pentoxide, calcium chloride, magnesium chloride, copper chloride, cesium fluoride, niobium fluoride, calcium bromide, vanadium bromide, a molecular sieve, a zeolite, magnesium oxide, etc. The inert liquid is also not particularly limited and may be: paraffin; liquid paraffin; a fluorine-containing solvent such as perfluoroalkane, perfluoroamine and perfluorether; a chlorine-containing solvent; silicone oil; etc.

EXAMPLES

The present invention will be explained in further detail by the following examples without intention of restricting the scope of the present invention defined by the claims attached hereto.

Example 1

A glass plate having a thickness of 0.2 mm was cut into 2.5 cm×2.5 cm in size to prepare a substrate. The substrate was put into a vacuum chamber and thereon was formed an ITO transparent electrode by DC magnetron sputtering using an ITO target having $SnO_2$-content of 10 weight % under a condition of substrate temperature of 100° C. and oxygen pressure of $1\times10^{-3}$ Pa. The ITO transparent electrode had a thickness of 0.2 μm and a surface resistance of 10 Ω/square.

The substrate with the ITO transparent electrode was put into a washing vessel and washed with IPA, and then subjected to UV-ozone treatment for 30 minutes. The ITO transparent electrode was spin-coated with poly(ethylene-dioxythiophene)-polystyrene sulfonic acid aqueous dispersion ("Baytron P" manufactured by BAYER AG., solid contents: 1.3%) and vacuum-dried at 150° C. for 2 hours to form a hole-injecting layer having a thickness of 100 nm.

A hole-transporting host material of polyvinylcarbazole with Mw of 63,000 manufactured by Aldrich Chemical Co., a phosphorescent material of tris(2-phenyl pyridine) iridium complex and an electron-transporting material of 2-(4-biphenylyl)-5-(4-t-butylphenyl)-1,3,4-oxadiazole (PBD) were dissolved in dichloroethane to prepare an application liquid. Weight ratio of polyvinylcarbazole, tris(2-phenyl pyridine) iridium complex and PBD was 40:1:12 in the application liquid.

Inner atmosphere of a glove box connected to a vapor deposition apparatus was replaced with a nitrogen gas having a moisture concentration of 30 ppm and an oxygen concentration of 30 ppm, and the above substrate having the hole-injecting layer and the application liquid were put into the glove box. The substrate was placed on a heater and dried at 150° C. for 2 hours in the glove box. Then, the substrate was unloaded from the heater and cooled down to the room temperature, and the application liquid was applied onto the hole-injecting layer by means of a spin-coater and dried at 100° C. for 2 hours in the glove box to form a light-emitting layer having a thickness of 100 nm. Next, the resultant substrate having the light-emitting layer was put into the vapor deposition apparatus connected to the glove box, on the light-emitting layer was placed a mask patterned such that a light-emitting device has a light-emitting area of 5 mm×5 mm, and a back side electrode was formed thereon by vapor depositing a magnesium-silver alloy with a mole ratio of magnesium/silver=10/1 into a thickness of 0.25 μm and by vapor depositing silver into a thickness of 0.3 μm, to provide a light-emitting structure.

The resulting light-emitting structure was put into the glove box and each of the ITO transparent electrode and the back side electrode was connected to an aluminum lead wire. The resultant was sealed with a sealing vessel of glass by an ultraviolet-hardening adhesive "XNR5493" manufactured by Nagase-Chiba Co. to produce a light-emitting device of Example 1.

Example 2

A light-emitting device of Example 2 was produced in the same manner as Example 1 except for using an argon gas having a moisture concentration of 70 ppm and an oxygen concentration of 80 ppm instead of the nitrogen gas having the moisture concentration of 30 ppm and the oxygen concentration of 30 ppm for replacing the inner atmosphere of the glove box.

Example 3

A light-emitting device of Example 3 was produced in the same manner as Example 1 except for using an argon gas having a moisture concentration of 100 ppm and an oxygen concentration of 100 ppm instead of the nitrogen gas having the moisture concentration of 30 ppm and the oxygen concentration of 30 ppm for replacing the inner atmosphere of the glove box.

Comparative Example 1

A light-emitting device of Comparative Example 1 was produced in the same manner as Example 1 except for using an argon gas having a moisture concentration of 200 ppm and an oxygen concentration of 30 ppm instead of the nitrogen gas having the moisture concentration of 30 ppm and the oxygen concentration of 30 ppm for replacing the inner atmosphere of the glove box.

Comparative Example 2

A light-emitting device of Comparative Example 2 was produced in the same manner as Example 1 except for using an argon gas having a moisture concentration of 30 ppm and an oxygen concentration of 200 ppm instead of the nitrogen gas having the moisture concentration of 30 ppm and the oxygen concentration of 30 ppm for replacing the inner atmosphere of the glove box.

Comparative Example 3

A light-emitting device of Comparative Example 3 was produced in the same manner as Example 1 except that the application liquid was applied onto the hole-injecting layer and dried not in the glove box but in the air. Comparative Example 4

A light-emitting device of Comparative Example 4 was produced in the same manner as Example 1 except that the light-emitting structure was sealed with the sealing vessel by the ultraviolet-hardening adhesive not in the glove box but in the air.

Example 4

A light-emitting device of Example 4 was produced in the same manner as Example 1 except that 2,2',2"-(1,3,5-benzenetriyl) tris[3-(2-methylphenyl)-3H-imidazo[4,5-b]pyridine] is vapor deposited on the light-emitting layer at a rate of 1 nm/second to form an electron-transporting layer having a thickness of 0.024 μm in the vapor deposition apparatus connected to the glove box and thereon was disposed the back side electrode.

Evaluation of Luminance, Light-Emitting Efficiency and Durability

Each of thus-obtained light-emitting devices was made to emit light while applying direct voltage thereto by "Source-Measure Unit 2400" manufactured by TOYO CORPORATION and measured with respect to luminance, whereby a maximum luminance $L_{max}$; an applied voltage $V_{max}$ at which the light-emitting device emits light having $L_{max}$; a light-emitting efficiency (external quantum efficiency) $\eta_{200}$ with which the light-emitting device emits light having a luminance of 200 cd/m$^2$; and a light-emitting efficiency (external quantum efficiency) $\eta_{2000}$ with which the light-emitting device emits light having a luminance of 2000 cd/m$^2$ of each device were found. Further, $L_{max}$, $V_{max}$, $\eta_{200}$ and $\eta_{2000}$ were measured again after leaving the light-emitting devices at 85° C. under a condition of 95% RH for 30 days to evaluate durability of each light-emitting device. Results were shown in Table 1.

TABLE 1

| | | $L_{max}$ (cd/m$^2$) | $V_{max}$ (V) | $\eta_{200}$ (%) | $\eta_{2000}$ (%) |
|---|---|---|---|---|---|
| Ex. 1 | Initial | 79000 | 11 | 12.4 | 10.2 |
| | After 30 days | 75000 | 11 | 12.1 | 9.9 |
| Ex. 2 | Initial | 66000 | 11 | 11.2 | 10.0 |
| | After 30 days | 63000 | 11 | 10.7 | 9.6 |
| Ex. 3 | Initial | 62000 | 11 | 10.5 | 9.1 |
| | After 30 days | 63000 | 11 | 10.0 | 8.8 |
| Comp. Ex. 1 | Initial | 55000 | 13 | 9.2 | 8.1 |
| | After 30 days | 44000 | 14 | 8.1 | 5.3 |
| Comp. Ex. 2 | Initial | 48000 | 15 | 8.1 | 6.9 |
| | After 30 days | 28000 | 17 | 6.2 | 4.5 |
| Comp. Ex. 3 | Initial | 35000 | 18 | 7.7 | 4.8 |
| | After 30 days | 12000 | 22 | 5.7 | 2.4 |
| Comp. Ex. 4 | Initial | 42000 | 18 | 8.0 | 4.8 |
| | After 30 days | 8600 | 25 | 4.5 | 1.4 |
| Ex. 4 | Initial | 96000 | 11 | 17.4 | 14.9 |
| | After 30 days | 92000 | 11 | 16.8 | 14.1 |

As shown in Table 1, each of the light-emitting devices of Examples 1 to 4 was produced by the method according to the present invention where the light-emitting layer, the back side electrode and the sealing parts were disposed in an atmosphere with a low moisture concentration and a low oxygen concentration to be excellent in the luminance, the light-emitting efficiency and the durability. In contrast with this, reductions of the luminance, the light-emitting efficiency and the durability were observed in the light-emitting devices of Comparative Examples 1 and 2 produced by disposing the light-emitting layer, the back side electrode and the sealing parts in an atmosphere with a high moisture concentration or a high oxygen concentration, respectively. Thus, it is important to lower both of the moisture concentration and the oxygen concentration in the present invention. Further, with respect to the light-emitting devices of Comparative Examples 3 and 4 produced by disposing the light-emitting layer or the sealing parts in the air respectively, the light-emitting properties and the durability were remarkably worsened. Thus, it was extremely desirable that the light-emitting layer and the sealing parts were both disposed in an atmosphere with low moisture and oxygen concentration in the present invention.

As described in detail above, the light-emitting device of the present invention efficiently utilizes the triplet excitons to be excellent in the luminance, the light-emitting efficiency and the durability. Further, the light-emitting device can be produced with reduced production costs and can be easily increased in emitting area to be useful for a full color display, a back light, a surface light source such as an illuminated light source, a light source array of a printer, etc.

What is claimed is:

1. A method for producing a light-emitting device comprising the steps of disposing a transparent electrode, one or more organic layers and a back side electrode on a substrate to provide a light-emitting structure, and disposing sealing parts on said light-emitting structure to isolate said one or more organic layers from external air, wherein said one or more organic layers comprises a light-emitting layer containing a phosphorescent compound, wherein said light-emitting layer and said back side electrode are formed in an inert gas atmosphere where both of a moisture concentration and an oxygen concentration are 100 ppm or less and said sealing parts are disposed in an inert gas atmosphere where both of a moisture concentration and an oxygen concentration are 100 ppm or less.

2. The method for producing a light-emitting device according to claim 1, wherein said one or more organic layers is isolated from external air after disposing said light-emitting layer until said sealing parts are disposed.

3. The method for producing a light-emitting device according to claim 1, wherein both of said moisture concentration and said oxygen concentration are 50 ppm or less.

4. The method for producing a light-emitting device according to claim 3, wherein both of said moisture concentration and said oxygen concentration are 30 ppm or less.

5. The method for producing a light-emitting device according to claim 1, wherein at least one of said organic layers is formed by a wet film-forming method.

6. The method for producing a light-emitting device according to claim 1, wherein said one or more organic layers comprises a hole-injecting layer in contact with said light-emitting layer and said hole-injecting layer is over said transparent electrode.

7. The method for producing a light-emitting device according to claim 6, wherein both of said hole-injecting layer and said light-emitting layer are formed by a wet film-forming method.

8. The method for producing a light-emitting device according to claim 6, wherein said one or more organic layers further comprises an electron-transporting layer between said light-emitting layer and said back side electrode.

9. The method for producing a light-emitting device according to claim 1, wherein a weight ratio of said phosphorescent compound in said light-emitting layer is 0.1 to 70 weight % based on the total weight of said light-emitting layer.

10. The method for producing a light-emitting device according to claim 1, wherein said phosphorescent compound is an ortho-metallation complex.

11. The method for producing a light-emitting device according to claim 1, wherein an ultraviolet-hardening resin is used in combination with said sealing parts to isolate said one or more organic layers from external air.

12. A method for producing a light-emitting device comprising the steps of:
   disposing a transparent electrode, one or more organic layers and a back side electrode on a substrate to provide a light-emitting structure;
   disposing sealing parts on said light-emitting structure to isolate said one or more organic layers from external air,
   wherein said one or more organic layers comprise a light-emitting layer containing a phosphorescent compound; and
   forming said light-emitting layer and said back side electrode in an inert gas atmosphere where both moisture concentration and oxygen concentration are 100 ppm or less and disposing said sealing parts in an inert gas atmosphere where both moisture concentration and oxygen concentration are 100 ppm or less; and
   said one or more organic layers is/are isolated from external air after forming said light-emitting layer until said sealing parts are disposed.

13. A method for producing a light-emitting device comprising the steps of:
   disposing a transparent electrode, one or more organic layers and a back side electrode on a substrate to provide a light-emitting structure;
   disposing sealing parts on said light-emitting structure to isolate said one or more organic layers from external air,
   wherein said one or more organic layers comprises a light-emitting layer containing a phosphorescent compound;
   forming said light-emitting layer and said back side electrode in an inert gas atmosphere where both moisture concentration and oxygen concentration are 30 ppm or less and disposing said sealing parts in an inert gas atmosphere where both moisture concentration and oxygen concentration are 30 ppm or less; and
   said one or more organic layers is/are isolated from external air after forming said light-emitting layer until said sealing parts are disposed.

14. A method for producing a light-emitting device comprising the steps of:
   disposing a transparent electrode, one or more organic layers and a back side electrode on a substrate to provide a light-emitting structure;
   disposing sealing parts on said light-emitting structure to isolate said one or more organic layers from external air,
   wherein said one or more organic layers comprises a light-emitting layer containing a phosphorescent compound; and
   forming said light-emitting layer and said back side electrode in an inert gas atmosphere where both moisture concentration and oxygen concentration are 100 ppm or less and disposing said sealing parts in an inert gas atmosphere where both moisture concentration and oxygen concentration are 30 ppm or less; and said one or more organic layers is/are isolated from external air after forming said light-emitting layer until said sealing parts are disposed, and wherein at least one of said organic layers is formed by a wet film-forming method.

15. A method for producing a light-emitting device consisting essentially of the steps of:
disposing a transparent electrode, one or more organic layers and a back side electrode on a substrate to provide a light-emitting structure; and
disposing sealing parts on said light-emitting structure to isolate said one or more organic layers from moisture and oxygen in external air;
wherein said one or more organic layers comprises a light-emitting layer containing a phosphorescent compound which utilizes triplet excitons for light emission,
wherein said light-emitting layer and said back side electrode are formed in an inert gas atmosphere where both of a moisture concentration and an oxygen concentration are 100 ppm or less and said sealing parts are disposed in an inert gas atmosphere where both of a moisture concentration and an oxygen concentration are 100 ppm or less.

16. The method for producing a light-emitting device according to claim 15, wherein both of said moisture concentration and said oxygen concentration are 50 ppm or less.

17. The method for producing a light-emitting device according to claim 16, wherein both of said moisture concentration and said oxygen concentration are 30 ppm or less.

18. The method for producing a light-emitting device according to claim 15, wherein at least one of said organic layers is formed by a wet film-forming method.

19. The method for producing a light-emitting device according to claim 15, wherein said one or more organic layers comprises a hole-injecting layer in contact with said light-emitting layer and said hole-injecting layer is over said transparent electrode.

20. The method for producing a light-emitting device according to claim 19, wherein both of said hole-injecting layer and said light-emitting layer are formed by a wet film-forming method.

21. The method for producing a light-emitting device according to claim 19, wherein said one or more organic layers further comprises an electron-transporting layer between said light-emitting layer and said back side electrode.

22. The method for producing a light-emitting device according to claim 15, wherein a weight ratio of said phosphorescent compound in said light-emitting layer is 0.1 to 70 weight % based on the total weight of said light-emitting layer.

23. The method for producing a light-emitting device according to claim 15, wherein said phosphorescent compound is an ortho-metallation complex.

24. The method for producing a light-emitting device according to claim 15, wherein an ultraviolet-hardening resin is used in combination with said sealing parts to isolate said one or more organic layers from external air.

25. The method of claim 15, wherein said one or more organic layers comprises a hole-injecting layer in contact with said light-emitting layer and said hole-injecting layer is over said transparent electrode, and an electron-transporting layer between said light-emitting layer and said backside electrode.

26. The method for producing a light-emitting device according to claim 25, wherein said hole-injecting layer and said light-emitting layer are formed by a wet film-forming method.

27. The method for producing a light-emitting device according to claim 26, wherein said hole-injecting layer, said light-emitting layer and said electron-transporting layer are formed by a wet film-forming method.

28. The method for producing a light-emitting device according to claim 27 wherein said transparent electrode is formed by a wet film-forming method.

29. A method for producing a light-emitting device according to claim 27 wherein said substrate is an inorganic material.

30. A method according to claim 27, wherein said backside electrode is most remote from the substrate, the transparent electrode is adjacent the substrate, and there are formed from the transparent electrode to the back side electrode the following layers in the recited sequence:
hole-transporting layer, light-emitting layer, and electron-transporting layer.

31. A method according to claim 27, wherein said backside electrode is most remote from the substrate, the transparent electrode is adjacent the substrate, and there are formed from the transparent electrode to the back side electrode the following layers in the recited sequence:
hole-transporting layer and light-emitting layer.

32. A method according to claim 27, wherein said backside electrode is most remote from the substrate, the transparent electrode is adjacent the substrate, and there are formed from the transparent electrode to the back side electrode the following layers in the recited sequence:
light-emitting layer, electron-transporting layer and electron-injecting layer.

33. A method according to claim 27, wherein said backside electrode is most remote from the substrate, the transparent electrode is adjacent the substrate, and there are formed from the transparent electrode to the back side electrode the following layers in the recited sequence:
hole-emitting layer and electron-transporting layer.

34. A method according to claim 27, wherein said backside electrode is most remote from the substrate, the transparent electrode is adjacent the substrate, and there are formed from the transparent electrode to the back side electrode the following layers in the recited sequence:
hole-emitting layer, hole-transporting layer, light-emitting layer, electron transporting layer and electron-injecting layer.

35. A method according to claim 27, wherein said backside electrode is most remote from the substrate, the transparent electrode is adjacent the substrate, and there are formed from the transparent electrode to the back side electrode the following layers in the recited sequence:
hole-injecting layer, light-emitting layer and electron-transporting layer.

36. The method for producing a light-emitting device according to claim 27, wherein said phosphorescent compound is an ortho-metallation complex or a porphyrin complex.

37. A method for producing a light-emitting device consisting essentially of the steps of:
disposing a transparent electrode, one or more organic layers and a back side electrode on a substrate to provide a light-emitting structure; and
disposing sealing parts on said light-emitting structure to isolate said one or more organic layers from moisture and oxygen in external air;

wherein said one or more organic layers comprises a light-emitting layer containing a phosphorescent compound which utilizes triplet excitons for light emission, wherein said light-emitting layer and said back side electrode are formed in an inert gas atmosphere where both of a moisture concentration and an oxygen concentration are 100 ppm or less and said sealing parts are disposed in an inert gas atmosphere where both of a moisture concentration and an oxygen concentration are 100 ppm or less, the moisture and oxygen content being such that the disappearance of triplet excitons is suppressed, wherein said one or more organic layers is isolated from external air after disposing said light-emitting layer solely due to said inert gas atmosphere until said sealing parts are disposed, the method steps consisting essentially of:

forming the transparent electrode on a glass plate as the substrate in a vacuum chamber; spin coating onto the transparent electrode an aqueous dispersion of a hole-injecting compound to form a hole-injecting layer;

forming an application liquid comprising a hole-transporting host material, a phosphorescent material and an electron-transporting material;

transferring the substrate having coated thereon the transparent electrode and the hole-injecting layer into a glove box from the vacuum chamber, where the inner atmosphere of the glove box has been replaced with an inert gas having a moisture content of less than 100 ppm and an oxygen content of less than 100 ppm, and introducing said application liquid into the glove box;

heating and drying the substrate carrying the transparent electrode and the hole-injecting layer in the glove box;

applying the application liquid onto the hole-injecting layer by spin-coating in the glove box to thereby form a light-emitting layer;

transferring the resultant product having the light-emitting layer into a vapor deposition apparatus connected to the glove box;

patterning the light-emitting layer to thereby provide a light-emitting structure; and returning the light-emitting structure to the glove box and interconnecting the transparent electrode and the back side electrode therein; and disposing the sealing parts on the light-emitting structure to isolate the one or more organic layers from the external air in the glove box.

* * * * *